United States Patent
Jagmohan et al.

(10) Patent No.: US 8,806,295 B2
(45) Date of Patent: Aug. 12, 2014

(54) MIS-CORRECTION AND NO-CORRECTION RATES FOR ERROR CONTROL

(75) Inventors: Ashish Jagmohan, Irving, NY (US); Luis A. Lastras-Montano, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 252 days.

(21) Appl. No.: 13/479,855

(22) Filed: May 24, 2012

(65) Prior Publication Data

US 2013/0318423 A1    Nov. 28, 2013

(51) Int. Cl.
*G11C 29/00* (2006.01)
*H03M 13/00* (2006.01)

(52) U.S. Cl.
USPC .......................................... 714/763; 714/785

(58) Field of Classification Search
USPC ......... 714/763, 785, 746, 752, 755, 799, 780, 714/819, 52, 6.24
See application file for complete search history.

(56) References Cited

U.S. PATENT DOCUMENTS

| | | | |
|---|---|---|---|
| 5,978,953 A | 11/1999 | Olarig | |
| 6,131,178 A | 10/2000 | Fujita et al. | |
| 6,256,763 B1 * | 7/2001 | Oh et al. ........................ | 714/784 |
| 6,779,148 B2 | 8/2004 | Tanaka | |
| 7,017,099 B2 | 3/2006 | Micheloni et al. | |
| 7,188,294 B2 | 3/2007 | Murillo | |
| 7,243,293 B2 * | 7/2007 | Chen ............................ | 714/781 |
| 7,831,895 B2 | 11/2010 | Lin | |
| 2004/0243887 A1 * | 12/2004 | Sharma et al. .................. | 714/52 |
| 2010/0287436 A1 | 11/2010 | Lastras-Montano et al. | |
| 2010/0287445 A1 | 11/2010 | Dell et al. | |
| 2010/0287454 A1 | 11/2010 | Dell et al. | |
| 2010/0293436 A1 | 11/2010 | Coteus et al. | |
| 2010/0293437 A1 | 11/2010 | Gollub et al. | |
| 2010/0293438 A1 | 11/2010 | Lastras-Montano et al. | |
| 2010/0299576 A1 | 11/2010 | Baysah et al. | |

OTHER PUBLICATIONS

M. Rakus, et al., "Double Error Correcting Codes with Improved Code Rates," Journal of Electrical Engineering, vol. 55, No. 3-4, 2004, pp. 89-94.

* cited by examiner

*Primary Examiner* — Christine Tu
(74) *Attorney, Agent, or Firm* — Cantor Colburn LLP

(57) ABSTRACT

An embodiment is a method for encoding data with an error correction code. The method includes receiving a first number of data symbols by a memory controller, receiving a second number of meta-data sub-symbols, generating a third number of check symbols using an ECC, where the third number includes a difference between a number of symbols in an ECC codeword and the first number and generating a mismatch vector from the check and meta-data sub-symbols, where a number of sub-symbols of the mismatch vector includes the second number. The method also includes generating an adjustment syndrome symbol by multiplying the mismatch vector by a matrix, generating the third number of adjusted check symbols responsive to the adjustment syndrome symbol, and generating a final codeword by concatenating the adjusted check symbols and the data symbols, where the final codeword includes the number of symbols in the ECC codeword.

24 Claims, 5 Drawing Sheets

MIS-CORRECTION AND NO-CORRECTION RATES FOR ERROR CONTROL

BACKGROUND

The present invention relates generally to computer memory, and more particularly to providing improved error control in a memory system.

Computer systems often require a considerable amount of high speed random access memory (RAM) to hold information such as operating system software, programs, and other data while a computer is powered on and operational. This information is normally binary, composed of patterns of 1's and 0's known as bits of data. The bits of data are often grouped and organized at a higher level. A byte, for example, is typically composed of 8 bits; more generally these groups are called symbols and may consist of any number of bits.

Memory device densities have continued to grow as computer systems have become more powerful. Currently it is not uncommon to have the RAM content of a single computer be composed of hundreds of trillions of bits. Unfortunately, the failure of just a portion of a single RAM device can cause the entire computer system to fail. When memory errors occur, which may be "hard" (repeating) or "soft" (one-time or intermittent) failures, these failures may occur as single cell, multi-bit, full chip or full memory module failures and all or part of the system RAM may be unusable until it is repaired. Repair turn-around-times can be hours or even days, which can have a substantial impact to a business dependent on the computer systems.

The probability of encountering a RAM failure during normal operations has continued to increase as the amount of memory storage in contemporary computers continues to grow.

Techniques to detect and correct bit errors have evolved into an elaborate science over the past several decades. Perhaps the most basic detection technique is the generation of odd or even parity where the number of 1's or 0's in a data word are "exclusive or-ed" (XOR-ed) together to produce a parity bit. For example, a data word with an even number of 1's will have a parity bit of 0 and a data word with an odd number of 1's will have a parity bit of 1, with this parity bit data appended to the stored memory data. If there is a single error present in the data word during a read operation, it can be detected by regenerating parity from the data and then checking to see that it matches the stored (originally generated) parity.

More sophisticated codes allow for detection and correction of errors that can affect groups of bits rather than individual bits. Reed-Solomon codes are an example of a class of powerful and well understood codes that can be used for these types of applications.

These error detection and error correction techniques are commonly used to restore data to its original/correct form in noisy communication transmission media or for storage media where there is a finite probability of data errors due to the physical characteristics of the device. Memory devices generally store data as voltage levels representing a 1 or a 0 in RAM and are subject to both device failure and state changes due to high energy cosmic rays and alpha particles.

Contemporary memory devices are often sensitive to alpha particle hits and cosmic rays causing memory bits to flip. These particles do not damage the device but can create memory errors. These are known as soft errors, and most often affect just a single bit. Once identified, the bit failure can be corrected by simply rewriting the memory location. The frequency of soft errors has grown to the point that it has a noticeable impact on overall system reliability.

Memory error correction codes (also referred to as "error control codes" or "ECCs") use a combination of parity checks in various bit positions of the data word to allow detection and correction of errors. Every time data words are written into memory, these parity checks are generated and stored with the data. Upon retrieval of the data, a decoder can use the parity bits thus generated together with the data message in order to determine whether there was an error and to proceed with error correction if feasible.

In some cases, error correction techniques are unable to identify errors ("no-correction") or may identify an error but incorrectly attempt to correct the errors ("mis-correction"). In an example, difficulty may arise in lowering no-correct rates and mis-correct rates for error patterns which are not guaranteed to be correctable by the code given the minimum distance and/or the redundancy of the code.

SUMMARY

An embodiment is a method for encoding data with an error correction code. The method includes receiving, by a memory controller, a first number of data symbols by a memory controller, receiving, by the memory controller, a second number of meta-data sub-symbols, generating, by the memory controller, a third number of check symbols using an error correction code (ECC), where the third number includes a difference between a number of symbols in an ECC codeword and the first number and generating, by the memory controller, a mismatch vector from the check symbols and the meta-data sub-symbols, where a number of sub-symbols of the mismatch vector includes the second number. The method also includes generating, by the memory controller, an adjustment syndrome symbol by multiplying the mismatch vector by a matrix, generating, by the memory controller, adjusted check symbols responsive to the adjustment syndrome symbol, wherein a number of adjusted check symbols equals the third number, and generating, by the memory controller, a final codeword by concatenating the adjusted check symbols and the data symbols, where the final codeword includes the number of symbols in the ECC codeword.

Another embodiment is a method for decoding data with an error correction code, the method including receiving, by a memory controller, a codeword from a memory device, generating, by the memory controller, a first number of syndrome symbols and generating a second number of modified syndrome symbols from the first number of syndrome symbols based on a potential correction of the codeword. The method also includes verifying an accuracy of the potential correction by extracting a sub-symbol of a modified syndrome symbol, a position of the modified syndrome symbol within the second number of modified syndrome symbols and a position of the sub-symbol within the modified syndrome symbol being pre-specified and verifying that the extracted sub-symbol is zero.

A further embodiment is a computer program product for encoding data with an error correction code. The computer program product includes a tangible storage medium readable by a processing circuit and storing instructions for execution by the processing circuit for performing a method. The method includes receiving a first number of data symbols in a memory controller, receiving a second number of meta-data sub-symbols, generating a third number of check symbols using an error correction code (ECC), where the third number comprises a difference between a number of symbols in an ECC codeword and the first number and generating a mismatch vector from the check symbols and the meta-data sub-symbols, where a number of sub-symbols of the mismatch vector comprises the second number. The method also includes generating an adjustment syndrome symbol by multiplying the mismatch vector by a matrix, generating adjusted check symbols responsive to the adjustment syndrome symbol, wherein a number of adjusted check symbols equals the third number; and generating a final codeword by concatenating the adjusted check symbols and the data symbols, where the final codeword comprises the number of symbols in the ECC codeword.

Additional features and advantages are realized through the techniques of the present embodiment. Other embodiments and aspects are described herein and are considered a part of the claimed invention. For a better understanding of the invention with the advantages and features, refer to the description and to the drawings.

BRIEF DESCRIPTION OF THE SEVERAL VIEWS OF THE DRAWINGS

The subject matter that is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Figure 1:
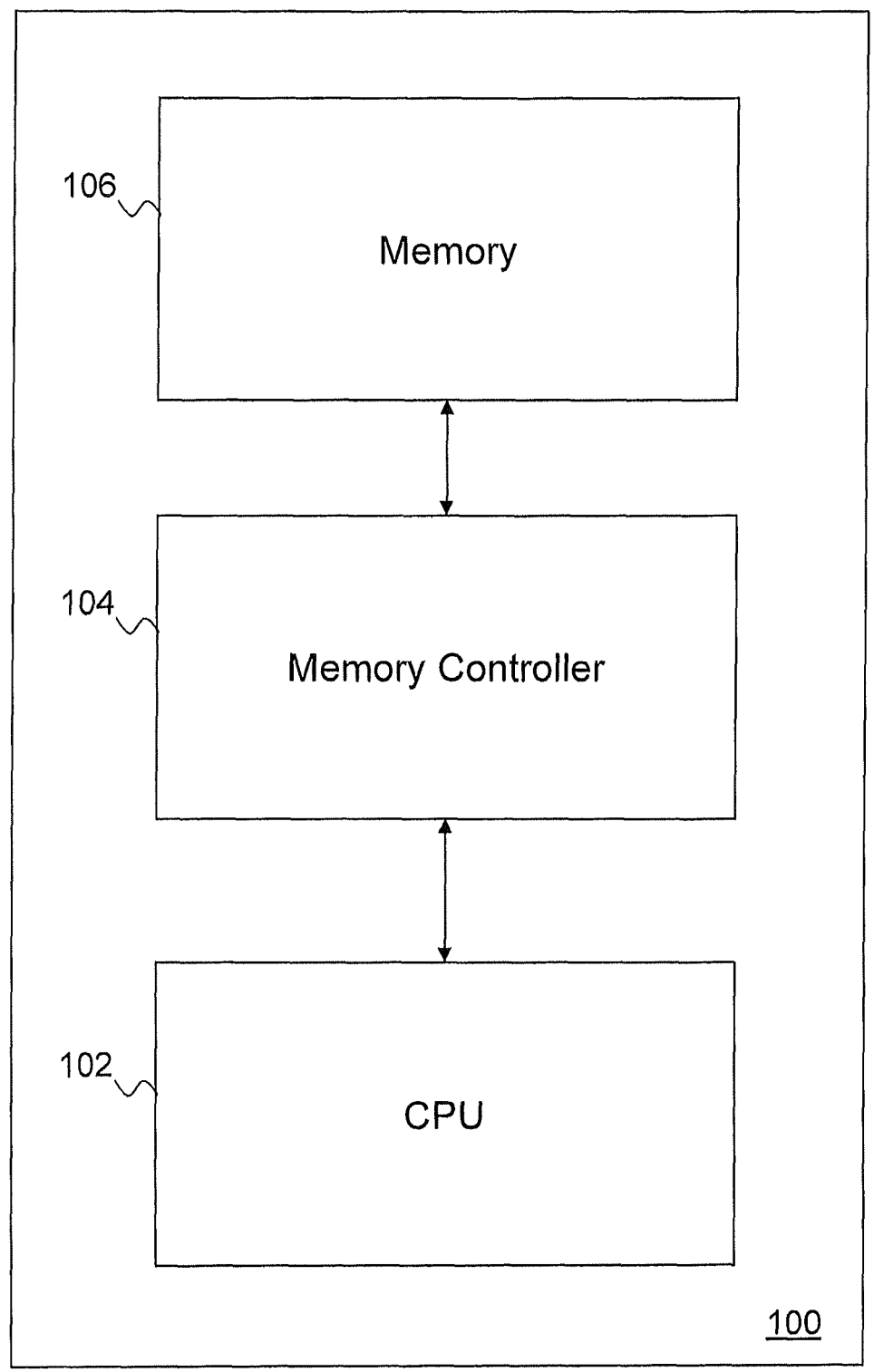
FIG. 1 illustrates a block diagram of a system for storing and retrieving data in a memory in accordance with an embodiment.

An embodiment is directed to improving the mis-correction and no-correction rates of an error control code (also referred to as "ECC" or "error correction code"). In some cases, an ECC may not accurately correct a word or data written to memory, causing a mis-correction of the word. Any code that can correct for errors (as opposed to codes that only detect errors) is in principle exposed to mis-corrections, such as when errors not supported by the code occur in the data. A memory system is preferably designed so the rate at which a data packet can be theoretically mis-corrected is extremely low, so that its occurrence in real systems is non-existent. When error control codes that can correct for errors are employed, and where the maximum number of errors to be corrected is controlled by a parameter, there is usually no single mis-correction rate that can be associated with the system. The reason for this is that the more errors that a code corrects results in a fewer amount of redundancy resources that the code has to detect possible problems in the correction procedure, making the mis-correction rate variable.

In some cases, an ECC may not correct an event but otherwise flag it as an uncorrectable error. For example, one might be interested in correcting chip failures, but not all chip failures may be 100% correctable by the error control code. The rate at which an error event is not correctable, the event being part of a class of errors that is generally correctable, is called the no-correct rate.

In an embodiment, additional bits in the ECC may be used as cyclic redundancy check (CRC) bits or codes to improve mis-correction rates. The use of additional bits as CRC codes may be associated with multiple shortcomings. For example, such CRC codes are generally not related mathematically to the underlying ECC code, and the implementation can result in undesirable complexity and latency. Latency of decoding can increase because such CRC codes may in some instances be decoded after the main (ECC) code has been decoded, resulting in a lengthening of the decoding procedure. In some cases, it is difficult to use CRC bits to improve no-correct rates, since mathematically they are not designed to serve the function of error correction, and rather typically serve to provide error detection.

An embodiment includes a system and method for error control coding for the case where the data symbol (and the checks) being written or read consists of a non-integer number of symbols. A non-integer number of symbols refers to the case where an integer number of data symbols (e.g., 64 symbols) is provided with an additional (non-integer, e.g. 65th) symbol that includes additional bits that a user wishes to store and protect, which are referred to as meta-data bits from now on. An encoding and decoding process uses a selected number (q-t, where q=ECC symbol size in bits and t=number of meta-data bits) of check bits in the additional symbol to simultaneously reduce both the mis-correct rates, as well as the no-correct rates for errors by a factor of $2^{(q-t)}$. Thus, if the partial check symbol has two check bits (i.e., q=8, t=6), the proposed invention yields a simultaneous factor of 4 improvement in both mis-correct and no-correct rates for a single code-word analysis (or "single-packet analysis"). This factor is squared if double-packet analysis is used. Similarly, if the partial check-symbol has 7 check bits (i.e., q=8, t=1), an improvement factor of 128 may be obtained for single-packet analysis, and an improvement factor of 1.6E4 for double packet analysis. The proposed method can be used to significantly improve the reliability of the ECC and memory system. It may also be used to reduce the block-sizes and/or latency while providing acceptable reliability. For example, it may allow single-packet analysis rather than double-packet analysis with acceptable reliability. In addition, in an embodiment, all data bits (the k full data symbols and the t meta-data bits) are reproduced verbatim at fixed predetermined locations within the generated final codeword, and can be thus be read directly. Further, the method and system adds very little overhead in terms of computational complexity/latency to the error control process. As discussed in examples herein, information or data may be grouped into symbols or bytes that comprise sub-symbols or bits.

FIG. 1 illustrates a block diagram of a system for storing and retrieving data in a memory in accordance with an embodiment. A system 100 depicted in FIG. 1 includes a computer processor 102, a memory 106 having memory cells, and a memory controller 104 for receiving data from the computer processor 102 to be stored in the memory 106. In an embodiment, the memory cells are arranged into pages, and pages are arranged into blocks. Thus, a block may contain a plurality of pages, each page containing a plurality of memory cells.

In one embodiment the memory controller 104 is coupled to the computer processor 102 and receives write requests from the computer processor 102. The write requests contain data to be written to the memory 106 and a logical address for identifying the location in the memory 106 to which the data will be written. The memory controller 104 stores data at a physical address within the memory 106. In an embodiment, the memory controller 104 maps the logic address to a physical address in the memory 106 when storing or retrieving data. The physical address for a given logical address may change each time data in the memory 106 is modified.

The system 100 is one example of a configuration that may be utilized to perform the processing described herein. Although the system 100 has been depicted with only a single memory 106, memory controller 104, and computer processor 102, it will be understood that other embodiments would also operate in other systems with two or more of the memory 106, memory controller 104, or computer processor 102. In an embodiment, the memory 106, memory controller 104, and computer processor 102 are not located within the same computer. For example, the memory 106 and memory controller 104 may be located in one physical location (e.g., on a memory module) while the computer processor 102 is located in another physical location (e.g., the computer processor 102 accesses the memory controller 104 via a network). In addition, portions of the processing described herein may span one or more of the memory 106, memory controller 104, and computer processor 102.

Figure 2:
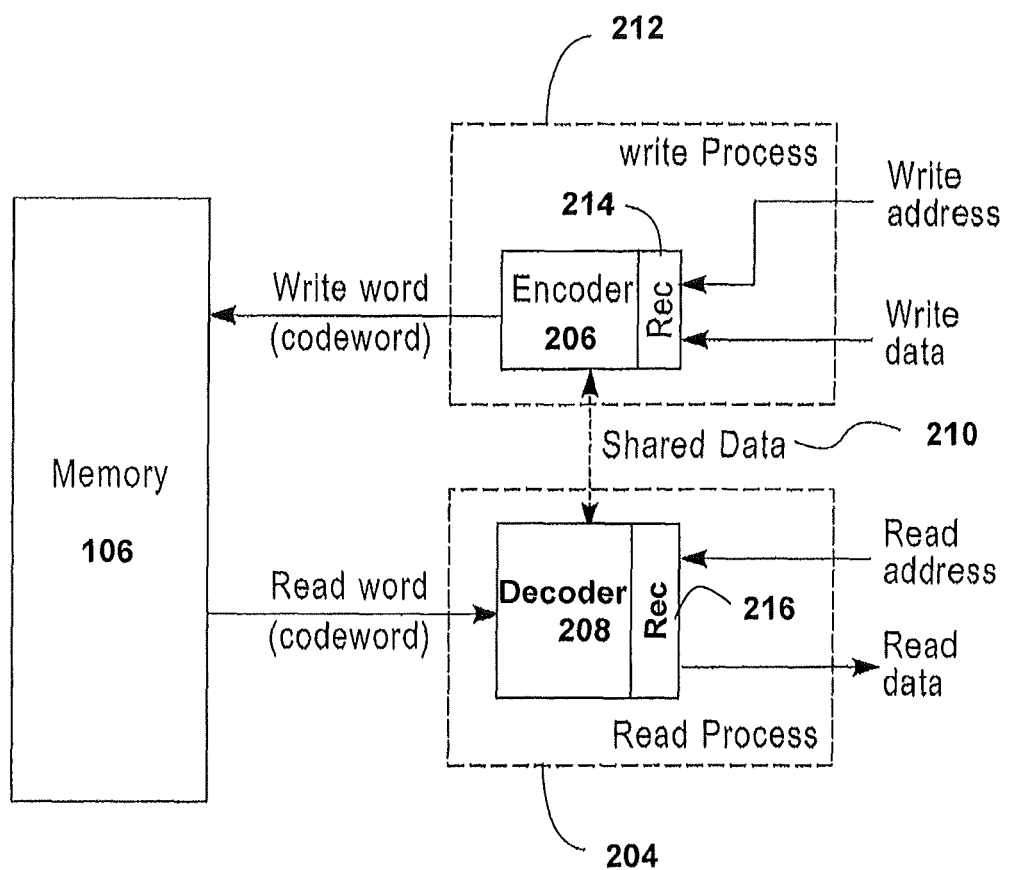
FIG. 2 illustrates a block diagram of a system for encoding and decoding data in a memory in accordance with an embodiment.

FIG. 2 illustrates a block diagram of a system for storing and retrieving data in a memory in accordance with an embodiment. The system depicted in FIG. 2 includes the memory 106 having blocks of memory cells (each block made up of pages), an encoder 206 (or "encoding module") for receiving write data and generating an expanded and encoded write word for storage in the memory cells. The system also includes a decoder 208 (or "decoding module") for receiving a read word from the memory 106 and decoding and generating read data. The system further includes shared data 210 storing characteristics of the stored data for use by both the encoder 206 and the decoder 208. In an embodiment, the encoder 206 and shared data 210 are utilized by a write process 212, and the decoder 208 and shared data 210 are utilized by a read process 204.

In one embodiment the encoder 206, decoder 208, and shared data 210 are located on a memory controller such as memory controller 104 of FIG. 1, or a memory module. In an alternate embodiment, the encoder 206, decoder 208, and shared data 210 are located on a memory device (not shown) or in a separate encoding or decoding module coupled to the memory controller 104 or the memory 106. The shared data 210 may be stored in a register or any other storage location that is accessible by both the encoder 206 and the decoder 208. In an embodiment, the encoder 206 may use the ECC process or algorithm to create a codeword to write, while the decoder 208 uses the ECC process to read the codeword and convert it to the original word.

Inputs to the encoder 206 depicted in FIG. 2 include the address of the page to be written (also referred to herein as a "write address"), and the data to be written to the page (also referred to herein as "write data"). As shown in FIG. 2, the inputs are received via a receiver 214 located on the encoder 206. The receiver 214 may be implemented in a variety of manners including hardware for receiving the inputs and/or a storage location (e.g., a register) where the inputs are located.

An input to the decoder 208 depicted in FIG. 2 includes the address of the memory location (e.g., a page) to be read. In an embodiment, the input is received via a receiver 216 (e.g., located on a memory device, memory module, memory controller, or other location). The receiver 216 may be implemented in a variety of manners including hardware for receiving the inputs and/or a storage location (e.g., a register) where the inputs are located. Although the receivers 214 and 216 are depicted relative to the encoder 206 and decoder 208 respectively, it will be understood that in other embodiments, the receivers 214 and 216 may by located externally to the encoder 206 and the decoder 208. In further embodiments, the receivers 214 and 216 may be physically located in a single module configured to receive both read and write requests.

An output from the decoder 208 depicted in FIG. 2 includes the read data. In an embodiment, the outputting is by a transmitter (e.g., located on a memory device, memory module, memory controller, or other location). The transmitter (not shown) may be implemented in a variety of manners including hardware for transmitting the output and a storage location or register where the outputs are stored. The encoder 206 and decoder 208 are examples of computers that may be utilized to perform the processing described herein.

For the purposes of one exemplary embodiment, the error control code that is employed is derived from a Reed-Solomon code whose symbols are bytes comprised of 8 bits. In the 72 byte codeword, 64 bytes will be dedicated to data, one byte will be dedicated to hold ancillary information and the additional 7 bytes will contain checks coming from a Reed-Solomon code. The byte that contains ancillary information will contain both additional check bits as well as meta-data bits. In one standard implementation, the additional check bits would be CRC bits that protect the data. In our invention, we will derive a new code starting from a Reed-Solomon code that, in the parlance of coding theory, has parameters [n=72, k=64] which as a consequence has 8 redundant symbols. Such a Reed-Solomon code has no space for meta-data bits. However in an embodiment described in further detail below, a method and system demonstrate how to allow for such check bits. Embodiments may take advantage of the fact that error control codes (including Reed-Solomon codes) can accept information about the location of failures in order to improve their error correction and detection capacity.

Figure 3A:
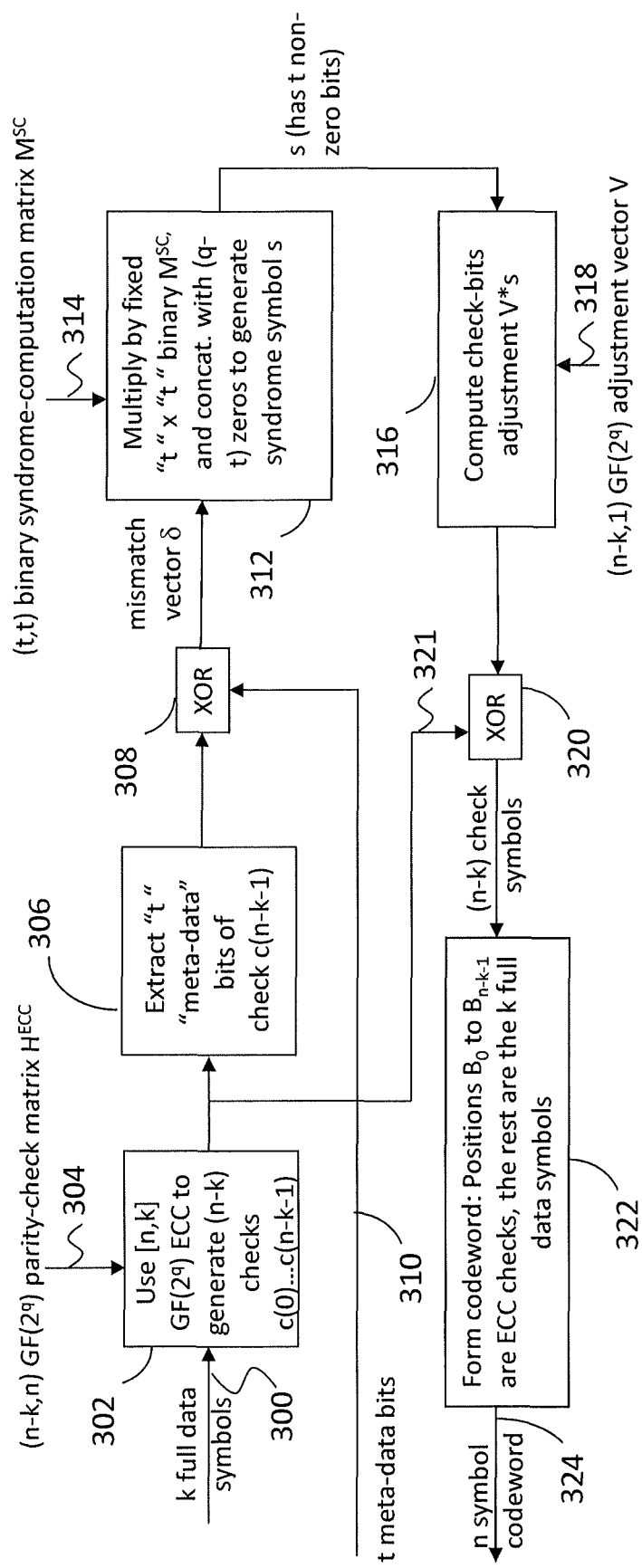
FIG. 3A illustrates a flow diagram of an encoder for receiving data and generating a codeword in accordance with an embodiment.

FIG. 3A illustrates a flow diagram for an encoder including blocks for receiving data and generating a codeword for storage in memory in accordance with an embodiment. In an example, at least a portion of the blocks are performed by a memory controller. For ease of explanation, the following table may be used to aid in understanding of an exemplary embodiment shown in FIG. 3A.

TABLE 1

| Parameter | Notation |
| --- | --- |
| ECC symbol size in bits | q |
| ECC codeword size in symbols | n |
| 'Full' data symbols | k |
| Additional data bits in 'partial' data symbol | t |
| 'Full' check-symbols | n − k − 1 |
| Total check bits | q(n − k − 1) + (q − t) |

A number ("k") of full data symbols 300 are received by a block 302. The block 302 also receives a parity check matrix input 304. In an embodiment, the parity check matrix is a (n−k, n) Galois Field ($2^q$) matrix, where n=an ECC codeword size in symbols, k=number of full data symbols and q=ECC symbol size in bits. The entries of the matrix are elements of Galois field $GF(2^q)$, and the notation (rows, col) when applied to a matrix denotes the number of rows and columns in the matrix. In block 302, a selected number of check symbols are generated using an ECC, which may include the matrix from input 304. In an embodiment, the selected number of check symbols generated equals the difference between n, the ECC codeword size in symbols, and k, number of full data symbols. For example, if n=72 and k=64, then the selected number of check symbols generated is 8. Block 306 receives the check symbols (or bytes) and extracts check bits (or sub-symbols) located in the positions corresponding to the meta-data bit positions, i.e. the positions of the meta-data bits in the final codeword. The meta-data bits or symbols received as input 310 may be received along with the data symbols input 300 by the memory controller. For example, the check bits are located within a selected check symbol (e.g., the 65$^{th}$ symbol). In an embodiment, in block 308 the meta-data bits and check bits are combined using an exclusive-or ("XOR") function to generate a resulting mismatch vector.

In block 314, a predetermined matrix input 314 is received, where the mismatch vector is multiplied by the matrix and the resultant bits are concatenated with a first number of zeroes to generate an adjustment syndrome symbol of a second length. In embodiments, the predetermined matrix ($M^{SC}$) is a "txt" binary syndrome-computation matrix, where t is the number of meta-data bits (sub-symbols). The first number of zeroes is the ECC symbol size in bits q (e.g., 8 bits) minus the number of meta-data bits, t. The second length of the generated adjustment syndrome symbol equals q. In block 316, a selected number of adjustment symbols are generated from the generated adjustment syndrome symbol and a predetermined adjustment vector input 318. In one embodiment, the adjustment vector is an (n-k, 1) Galois Field ($2^q$) adjustment vector V. Exemplary formulas and equations for determining the adjustment vector for input 318 and the matrix of input 314 are discussed in detail below. In block 320, the adjustment symbol from block 316 is then combined with input 321 including the check symbols generated in block 304 using an exclusive-or ("XOR") function in block 320. Block 322 receives the resulting final adjusted check symbols from block 320 and generates or forms the final codeword by concatenating the ECC checks (e.g., final adjusted check symbols) and the full data symbols received in input 300. Accordingly, output 324 enables reading of the data and metadata bits (sub-symbols) directly from the final codeword. In other words, the data and metadata bits are represented verbatim, in the stored codeword. In the parlance of coding theory, this is a systematic code, instead of a code that stores data bits in some encoded form.

In an embodiment, the final codeword construction provides that the "t" meta-data bits are produced verbatim in codeword symbol (n-k-1). The embodiment also provides that syndrome vector of final codeword has (n-k-1) zero syndromes, and the (n-k)th syndrome has (q-t) zero bits in fixed locations. The additional (q-t) zero bits in the last syndrome allow a $2^{(q-t)}$ improvement in both no-correct and mis-correct rates using the depicted modified-syndrome based decoding algorithm. In addition, the depicted process provides the improved error control with a relatively small increase in complexity.

Further, in embodiments, the predefined matrix $M^{SC}$ and predetermined vector V may be produced by utilizing the equations and steps discussed below. To illustrate the encoding method using an example, we will consider the case where the ECC symbol size is 8 bits, the ECC codeword size is 72 symbols, the data size is 64 symbols, and there are an additional 5 meta-data bits to be encoded. Thus there are 7 "full" check symbols and an additional 3 check bits which can be used to improve the ECC mis-correct and no-correct rate. Further, for the purpose of illustration, we will assume that the structure of the ECC codeword is the following: symbols 0 to 6 in the codeword are the "full" check symbols, symbol 7 includes the 5 meta-data bits and the 3 additional check-bits, and symbols 8 to 71 are the data symbols.

Figure 3B:
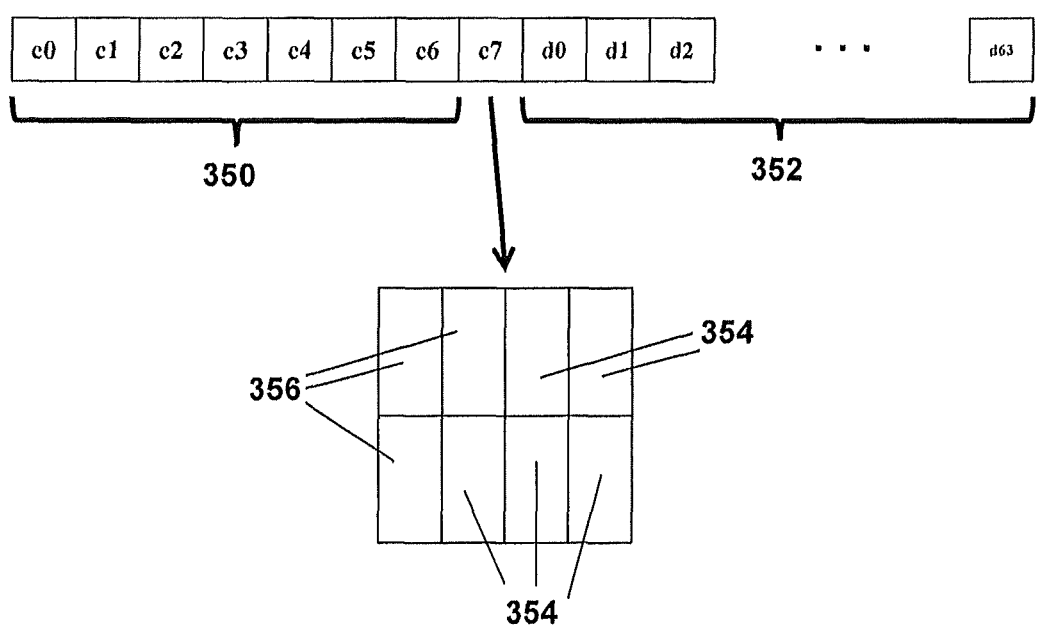
FIG. 3B illustrates an generated codeword in accordance with an embodiment.

FIG. 3B is a graphical illustration of an exemplary ECC codeword. Check symbols 350 are denoted $c_i$ and data symbols 352 are denoted $d_i$. Symbols $c_e$ through $c_6$ are the "full" check symbols, and symbol $c_7$ is the "partial" check symbol which contains 5 meta-data bits 354 at pre-specified locations and 3 check bits 356 in the other locations. Symbols $d_e$ to are the $d_{6z}$ data symbols. During a write operation, the ECC codeword is generated by the ECC encoder and written to memory, and, during a read operation, it is read from the memory and decoded by the ECC decoder.

The exemplary ECC encoder uses three pre-computed quantities: an 8×72 GF(256) parity check matrix H (i.e. H has 8 rows, 72 columns, and each element of H is an element of GF(256), a 5×5 binary syndrome-computation matrix $M^{SC}$, and an 8×1 GF(256) adjustment vector V. The input data vector is a 64×1 GF(256) vector d. This data vector is processed by the parity check matrix H to produce an initial 8×1 GF(256) check vector α, such that the H-syndrome of $[α^T d^T]^T$ is zero. We find α such that $$H[^α_d]=0[H_α H_d][^α_d]=0$$

$$α=H_α^{-1}H_d d \qquad (1)$$

where $H_α$ and $H_d$ are sub-matrices of H. Denote the individual check symbols which constitute α as $α_0$ to $α_7$. Now, $α_7$ is the initial check-symbol corresponding to the symbol location which will contain the meta-data bits. Let $l_e$ to $l_a$ ($0 \le l_i \le 7$) be the pre-computed 5 meta-data bit locations in the "partial" check symbol where the meta-data bits will be reproduced. Let $α_7^{l_e}$ to $α_7^{l_a}$ be the 5 bit values in $α_7$ in the bit-locations corresponding to the locations $l_e$ to $l_a$. Further, let $m_0$ to $m_4$ be the 5 meta-data bit values. Once α has been computed, the next step is to compute the binary mismatch vector using the following.

$$δ_i = α_7^{l_i} + m_i, 0 \le i \le 4 \qquad (2)$$

The 5×1 binary mismatch vector is defined to be $δ = [δ_0 δ_1 δ_2 δ_3 δ_4]^T$. The next step is to multiply the syndrome-computation matrix $M^{SC}$ with the mismatch vector, to generate 5 bits of the GF(256) adjustment syndrome symbol S. Let $$[σ_0 σ_1 σ_2 σ_3 σ_4]^T = M^{SC} δ \qquad (3)$$

then the adjustment syndrome symbol is computed by setting the bits $S_{λ_i} = σ_i$, $0 \le i \le 4$ where $λ_i$ are pre-specified bit locations, and setting the remaining three bits of s to 0. The adjustment syndrome symbol s is then multiplied by the adjustment vector V in order to produce 8 check-adjustment symbols $κ_0$ to $κ_7$. The final check symbols are computed as $$c_i = α_k + κ_i, 0 \le i \le 7. \qquad (4)$$

We now describe how the quantities H, $M_{SC}$ and V are pre-computed. H is the parity-check matrix of a (72, 64) linear code. A possible selection for the parity-check matrix may be the parity-check matrix of a (72, 64) maximum-distance separable (MDS) algebraic code over GF(256). Let $$H_α^{-1} = \begin{bmatrix} & γ_0 \\ A & \ldots \\ & γ_7 \end{bmatrix} \qquad (5)$$

where A is a 8×7 GF(256) matrix, and $γ_0$ to $γ_7$ are GF(256) symbols. Let multiplication of an arbitrary GF(256) symbol β by the fixed symbol $γ_7$ be equivalent to multiplying binary-vector representation of β by the binary 8×8 matrix G. Let $G_t$ be a 5×5 full-rank binary submatrix of the matrix G. Then $M^{SC} = G_t^{-1}$, and $V = [γ_0 γ_7]^T$. Further, the positions of the 5 rows of G that constitute $G_r$ determine the 5 locations $l_i$ of the meta-data bits, and the positions of the 5 columns of G that constitute $G_t$ determine the 5 locations $\lambda_i$ where the adjustment syndrome is potentially non-zero. In another embodiment, the desired locations $l_i$ and $\lambda_i$ are pre-specified, and the parity check matrix H is designed such that the sub-matrix $G_t$ formed by extracting the desired rows and columns of G has full rank. In an embodiment the parity-check matrix H is for a Reed-Solomon code, and the desired sub-matrix properties are obtained by searching over the Galois field $GF(2^q)$ for an element which induces a $\gamma_7$ with the desired full-rank sub-matrix property.

As appreciated by those skilled in the art, the above construction can be extended to cases with different numbers of data symbols, check symbols and meta-data bits (or sub-symbols), and to cases where the data symbols and the parity check matrix symbols have field sizes different from GF(256).

Figure 4:
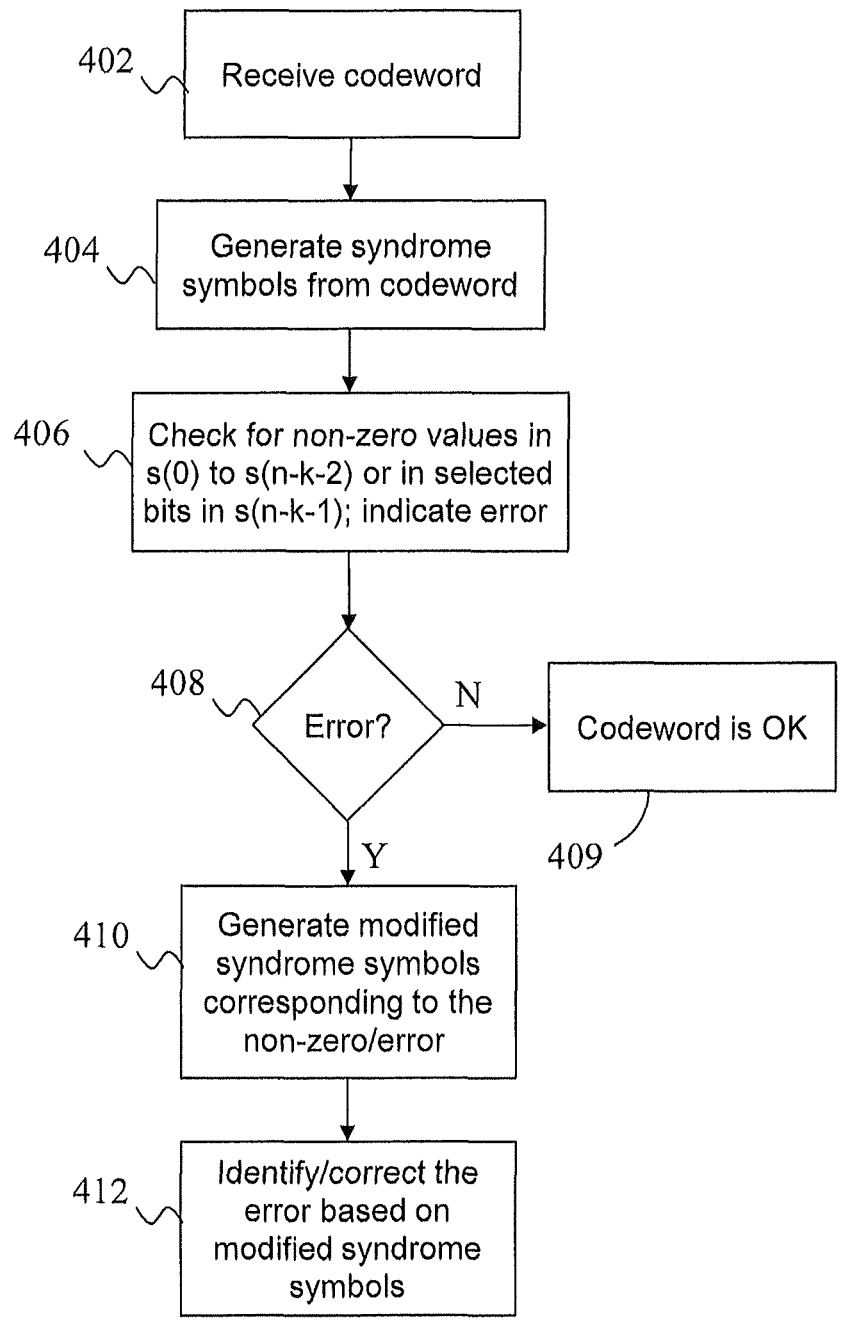
FIG. 4 illustrates a flow diagram for an exemplary decoder including blocks for receiving the codeword and identifying errors in the data in accordance with an embodiment.

In embodiments, the codeword generated by the flow chart described in FIG. 3 may generate a selected number of syndrome symbols during decoding. FIG. 4 illustrates a flow diagram for an exemplary decoder including blocks for receiving the codeword and identifying errors in the data. In block 402, a codeword is received by the decoder from a memory device. In block 404, syndrome symbols are generated from the codeword. In block 406, the decoder checks for non-zero values in selected syndrome symbols, such as s(0) to s(n−k−2). In one embodiment, when syndrome symbols s(0) to s(n−k−2) are zero values and syndrome symbol s(n−k−1) has (q−t) zero value bits in (q−t) fixed, pre-specified locations, the decoder declares that no error has occurred. In block 408, an error is indicated based on the syndrome symbols. Syndrome symbol values of zero in the specified locations indicate that there are no errors in the codeword, as shown in block 409. In block 410, if an error is indicated, modified syndrome symbols in order to find potential error corrections, wherein the term correction refers to a set of locations wherein the codeword is in error. Once such a correction is found, the error magnitudes at the set of locations can be computed by a suitable method, and the codeword can then be corrected by combining it with a bit-pattern which is computed as a function of the correction and the error magnitudes.

In block 412, the error is identified and/or corrected based on the modified syndrome symbols. If an error is present, in an embodiment the decoder has a list of potential corrections which may result in finding the error that has occurred. For each potential correction the decoder generates a corresponding set of n' modified syndromes (generation of such modified syndromes may be performed by any suitable method known in the art), denoted m(0) to m(n'−1). These modified syndromes might have a natural ordering; for example, in an embodiment, modified syndrome m(i) is computed as a function of syndromes s(0) to s(i−c) for a fixed constant c, but is not dependent on syndrome s(i−c+1) to s(n−k−1) in that modified syndrome In an embodiment, in order to verify the correctness or accuracy of the potential correction i,e, in order to verify that the potential correction corresponds to the actual error which has occurred, the decoder extracts a sub-symbol of (q−t) bits (from a fixed, pre-specified (q−t) bit locations inside the symbol), from a modified syndrome at a pre-specified position in the ordered list of modified syndrome symbols, for example modified syndrome symbol m(n'−1). The decoder then checks that the sub-symbol has zero value, and that all other modified syndromes m(0) to m(n'−2) have zero value. If this is the case, the potential correction is a valid candidate for correcting the codeword. The decoder performs the above steps for one or more of the potential corrections from the list of potential corrections. In an embodiment, if none or more than one of the potential corrections appear valid, the decoder declares an uncorrectable error. In another embodiment the decoder reports all valid corrections and the corresponding corrected codewords.

Thus, possible error corrections correspond to the case where all but one of the modified syndrome symbols are all-zero, and the last syndrome has (q−t) non-zero bits in the fixed known locations. The additional (q−t) syndrome bits (or "sub-symbols") in the last or final syndrome symbol are not present in a conventional code; these lower the probability that a non-erroneous correction will be considered valid by a factor of $2^{(q-t)}$. No-corrects may happen when a non-erroneous correction is mistakenly thought to be valid; thus the additional (q−t) bits cause an improvement of $2^{(q-t)}$ in the no-correct rate for certain error patterns over embodiments that do not include the additional (q−t) syndrome bits. In addition, mis-correct rates are also reduced by the additional (q−t) syndrome bits. Mis-corrects happen when an uncorrectable error pattern looks like a different correctable error-pattern (i.e., the correctable error pattern yields the desired modified syndrome symbols). Accordingly, the additional (q−t) syndrome bits lower this probability by $2^{(q-t)}$.

Technical effects and benefits include a low-complexity error correction method which offers increased reliability in storage of data in memory, while allowing partial check symbols to be used.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Further, as will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method for encoding data with an error correction code, the method comprising:
    receiving, by a memory controller, a first number of data symbols;
    receiving, by a memory controller, a second number of meta-data sub-symbols;
    generating, by the memory controller, a third number of check symbols using an error correction code (ECC), where the third number comprises a difference between a number of symbols in an ECC codeword and the first number;
    generating, by the memory controller, a mismatch vector from the check symbols and the meta-data sub-symbols, where a number of sub-symbols of the mismatch vector comprises the second number;
    generating, by the memory controller, an adjustment syndrome symbol by multiplying the mismatch vector by a matrix;
    generating, by the memory controller, adjusted check symbols responsive to the adjustment syndrome symbol, wherein a number of adjusted check symbols equals the third number; and
    generating, by the memory controller, a final codeword by concatenating the adjusted check symbols and the data symbols, wherein the final codeword comprises the number of symbols in the ECC codeword.

2. The method of claim 1, wherein generating the adjusted check symbols comprises generating adjustment symbols by multiplying the adjustment syndrome symbol by an adjustment vector, wherein a number of symbols in the adjustment vector comprises the third number; and combining the adjustment symbols and the check symbols to generate the adjusted check symbols.

3. The method of claim 2, wherein generating the mismatch vector from the third number of check symbols and the meta-data sub-symbols comprises extracting check sub-symbols located in positions corresponding to meta-data sub-symbol locations within the final codeword.

4. The method of claim 3, wherein generating the mismatch vector from the third number of check symbols and the meta-data sub-symbols further comprises combining the extracted check sub-symbols and the meta-data sub-symbols via an exclusive-or operation.

5. The method of claim 2, wherein generating the adjustment syndrome symbol by multiplying the mismatch vector by the matrix comprises multiplying the mismatch vector by a predefined matrix to produce a result and concatenating a selected number of zeros with the adjustment syndrome symbol in predefined locations, wherein the selected number comprises a difference between an amount of sub-symbols in an ECC symbol and the second number of meta-data sub-symbols.

6. The method of claim 2, wherein generating the final codeword comprises providing the received first number of data symbols at a predetermined location in the final codeword, wherein the data symbols may be read directly from the final codeword.

7. A method for decoding data with an error correction code, the method comprising:
receiving, by a memory controller, a codeword from a memory device;
generating, by the memory controller, a first number of syndrome symbols;
generating a second number of modified syndrome symbols from the first number of syndrome symbols based on a potential correction of the codeword; and
verifying an accuracy of the potential correction by extracting a sub-symbol of a modified syndrome symbol, a position of the modified syndrome symbol within the second number of modified syndrome symbols and a position of the sub-symbol within the modified syndrome symbol being pre-specified and verifying that the extracted sub-symbol is zero.

8. The method claim 7, wherein generating the second number of modified syndrome symbols and verifying the accuracy of the potential correction are performed for each potential correction in a list of potential corrections.

9. The method of claim 8 further comprises declaring an uncorrectable error if more than one of the potential corrections on the list leads to a zero sub-symbol.

10. The method of claim 8 further comprises declaring an uncorrectable error if none of the potential corrections on the list lead to a zero sub-symbol.

11. The method of claim 7, wherein modified syndrome symbols have an ordering by position, and a modified syndrome symbol used for the verifying is a final modified syndrome in the ordering.

12. The method of claim 7 further comprises extracting a sub-symbol of a syndrome symbol, the position of the syndrome symbol within the first number of syndrome symbols and the position of the sub-symbol within the syndrome symbol being pre-specified, and declaring no errors if the sub-symbol is zero and if all other syndrome symbols are zero.

13. A computer program product for encoding data with an error correction code, the computer program product comprising:
a tangible non-transitory storage medium readable by a processing circuit and storing instructions for execution by the processing circuit for performing a method comprising:
receiving a first number of data symbols in a memory controller;
receiving a second number of meta-data sub-symbols;
generating a third number of check symbols using an error correction code (ECC), where the third number comprises a difference between a number of symbols in an ECC codeword and the first number;
generating a mismatch vector from the check symbols and the meta-data sub-symbols, where a number of sub-symbols of the mismatch vector comprises the second number;
generating an adjustment syndrome symbol by multiplying the mismatch vector by a matrix;
generating adjusted check symbols responsive to the adjustment syndrome symbol, wherein a number of adjusted check symbols equals the third number; and
generating a final codeword by concatenating the adjusted check symbols and the data symbols, wherein the final codeword comprises the number of symbols in the ECC codeword.

14. The computer program product of claim 13, wherein generating the adjusted check symbols comprises generating adjustment symbols by multiplying the adjustment syndrome symbol by an adjustment vector, wherein a number of symbols in the adjustment vector comprises the third number; and combining the adjustment symbols and the check symbols to generate the adjusted check symbols.

15. The computer program product of claim 14, wherein generating the mismatch vector from the third number of check symbols and the meta-data sub-symbols comprises extracting check sub-symbols located in positions corresponding to meta-data sub-symbol locations within the final codeword.

16. The computer program product of claim 15, wherein generating the mismatch vector from the third number of check symbols and the meta-data sub-symbols further comprises combining the extracted check sub-symbols and the meta-data sub-symbols via an exclusive-or operation.

17. The computer program product of claim 14, wherein generating the adjustment syndrome symbol by multiplying the mismatch vector by the matrix comprises multiplying the mismatch vector by a predefined matrix to produce a result and concatenating a selected number of zeros with the adjustment syndrome symbol in predefined locations, wherein the selected number comprises a difference between an amount of sub-symbols in an ECC symbol and the second number of meta-data sub-symbols.

18. The computer program product of claim 14, wherein generating the final codeword comprises providing the received first number of data symbols at a predetermined location in the final codeword, wherein the data symbols may be read directly from the final codeword.

19. A computer program product for decoding data with an error correction code, the computer program product comprising:
a tangible non-transitory storage medium readable by a processing circuit and storing instructions for execution by the processing circuit for performing a method comprising:
receiving a codeword from a memory device;
generating a first number of syndrome symbols;

generating a second number of modified syndrome symbols from the first number of syndrome symbols responsive to a potential correction of the codeword; and verifying an accuracy of the potential correction by extracting a sub-symbol of a modified syndrome symbol, a position of the modified syndrome symbol within the second number of modified syndrome symbols and a position of the sub-symbol within the modified syndrome symbol being pre-specified and verifying that the extracted sub-symbol is zero.

20. The computer program product of claim 19, wherein generating the second number of modified syndrome symbols and verifying the accuracy of the potential correction for each potential correction in a list of potential corrections.

21. The computer program product of claim 20 further comprises declaring an uncorrectable error if more than one of the potential corrections on the list leads to a zero sub-symbol.

22. The computer program product of claim 20 further comprises declaring an uncorrectable error if none of the potential corrections on the list lead to a zero sub-symbol.

23. The computer program product of claim 19, wherein modified syndrome symbols have an ordering by position, and the modified syndrome symbol used for the verifying is a final modified syndrome in the ordering.

24. The computer program product of claim 19 further comprises extracting a sub-symbol of a syndrome symbol, the position of the syndrome symbol within the first number of syndrome symbols and the position of the sub-symbol within the syndrome symbol being pre-specified, and declaring no errors if the sub-symbol is zero and if all other syndrome symbols are zero.

\* \* \* \* \*